(12) United States Patent
Mashino

(10) Patent No.: US 11,659,667 B2
(45) Date of Patent: May 23, 2023

(54) WIRING BOARD AND METHOD OF MANUFACTURING WIRING BOARD

(71) Applicant: SHINKO ELECTRIC INDUSTRIES CO., LTD., Nagano (JP)

(72) Inventor: Naohiro Mashino, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 15 days.

(21) Appl. No.: 17/381,746

(22) Filed: Jul. 21, 2021

(65) Prior Publication Data

US 2022/0046800 A1 Feb. 10, 2022

(30) Foreign Application Priority Data

Aug. 4, 2020 (JP) .............................. JP2020-132588

(51) Int. Cl.
*H05K 1/11* (2006.01)
*H05K 3/00* (2006.01)
*H05K 3/06* (2006.01)
*H05K 3/42* (2006.01)

(52) U.S. Cl.
CPC .............. *H05K 3/002* (2013.01); *H05K 1/115* (2013.01); *H05K 3/064* (2013.01); *H05K 3/423* (2013.01)

(58) Field of Classification Search
None
See application file for complete search history.

(56) References Cited

U.S. PATENT DOCUMENTS

| 7,663,239 B2* | 2/2010 | Ikeda ................ H01L 23/53238 438/608 |
| 7,956,465 B2* | 6/2011 | Huang .............. H01L 21/76846 257/E23.161 |
| 2002/0130046 A1* | 9/2002 | Cheung .................... C25D 3/38 205/120 |
| 2002/0190375 A1* | 12/2002 | Mashino ................. H01L 24/05 257/734 |
| 2014/0339699 A1* | 11/2014 | Arvin ................ H01L 21/76885 257/738 |
| 2020/0163228 A1* | 5/2020 | Lee ...................... H05K 3/0032 |

FOREIGN PATENT DOCUMENTS

| JP | S55-003676 | 1/1980 |
| JP | 2005-347438 | 12/2005 |

* cited by examiner

*Primary Examiner* — Timothy J Thompson
*Assistant Examiner* — John B Freal
(74) *Attorney, Agent, or Firm* — Rankin, Hill & Clark LLP

(57) ABSTRACT

A wiring board includes an insulating layer; an insulating oxide film that is formed by forming a film of metal oxide or semimetal oxide on a surface of the insulating layer; a seed layer that is made of metal and that is stacked on the insulating oxide film; and an electrode that is made of metal and that is formed on the seed layer, wherein the insulating oxide film and the seed layer are removed from an area not overlapping the electrode to expose the insulating layer.

8 Claims, 17 Drawing Sheets

WIRING BOARD AND METHOD OF MANUFACTURING WIRING BOARD

CROSS-REFERENCE TO RELATED APPLICATION

This application is based upon and claims the benefit of priority of the prior Japanese Patent Application No. 2020-132588, filed on Aug. 4, 2020, the entire contents of which are incorporated herein by reference.

FIELD

The embodiments discussed herein are related to a wiring board and a method or manufacturing a wiring board.

BACKGROUND

In general, a wiring board including fine wirings is manufactured, for example, by forming a seed layer serving as a cathode on a surface of an insulating base material, such as polyimide, and forming electrodes of metal, such as copper, on the seed layer, for example, by electrolytic plating. Like the electrodes, the seed layer is a layer made of metal, such as copper, and covers the entire surface of the base material. In order to increase adhesion between the seed layer and the base material, for example, an adhesion layer using metal, such as titanium, may be formed between the seed layer and the base material.

The seed layer and the adhesion layer are formed by, for example, sputtering. In other words, titanium sputtering on the surface of the base material forms the adhesion layer and copper sputtering on the surface of the adhesion layer forms the seed layer. For example, oxide of transition metal, such as titanium or hafnium, may be used as the adhesion layer and, in that case, an insulating adhesion layer is formed.

Patent Literature 1: Japanese Laid-open Patent Publication No. S55-3676

Patent Literature 2: Japanese Laid-open Patent Publication No. 2005-347438

After the electrodes are formed on the seed layer, the seed layer is removed by, for example, etching between adjacent electrodes. In other words, for example, when the seed layer is formed using copper, the seed layer between the electrodes is removed by wet etching using a copper etching solution (etching solution A).

In a wiring board in which an adhesion layer, seed laver, and electrodes are stacked in sequence on a base material however has a problem in that short circuit between the electrodes and decrease in reliability would occur. Specifically, on removal of the seed layer and the adhesion layer between the electrodes by wet etching from an intermediate structure in which the electrodes are formed by electrolytic copper plating on the seed layer, when the time in which the intermediate structure is immersed in an etching solution (etching solution A) is long, side etching in which side surfaces of the electrodes that are formed using copper like the seed layer are etched occurs. Thus, the intermediate structure not immersed excessively in the etching solution (etching solution A) for a long time. When the etching time is excessively shortened in order to reduce side etching, however, residue of the seed layer may remain on the adhesion layer. As a result, even when the adhesion layer is insulating, the residue remaining on the surface of the adhesion layer cause short circuit between the adjacent electrodes and decrease in reliability.

When the adhesion layer is formed of metal, such as titanium, the adhesion layer is etched after the seed layer is etched and a titanium etching solution (etching solution B) etches copper faster than titanium and accordingly the copper etching rate increases. For this reason, when the adhesion layer is etched, side etching in which the side surfaces of the electrodes are etched occurs. When the time in which the intermediate structure is immersed in the titanium etching solution (etching solution B) is shortened excessively in order to inhibit side etching, titanium that is a conductor remains between the electrodes and short circuit between the electrodes and decrease in reliability occur. Such short circuit between electrodes and decrease in reliability highly likely occur particularly in a wiring board having fine wirings in which the distance between adjacent electrodes is small.

SUMMARY

According to an aspect of an embodiment, a wiring board includes: an insulating layer; an insulating oxide film that is formed by forming a film of metal oxide or semimetal oxide on a surface of the insulating layer; a seed layer that is made of metal and that is stacked on the insulating oxide film; and an electrode that is made of metal and that is formed on the seed layer. The insulating oxide film and the seed layer are removed from an area not overlapping the electrode to expose the insulating layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments of a wiring board and a method of manufacturing a wiring board disclosed herein will be described in detail below with reference to the drawings. The embodiments do not limit the present invention.

[a] First Embodiment

Figure 1:
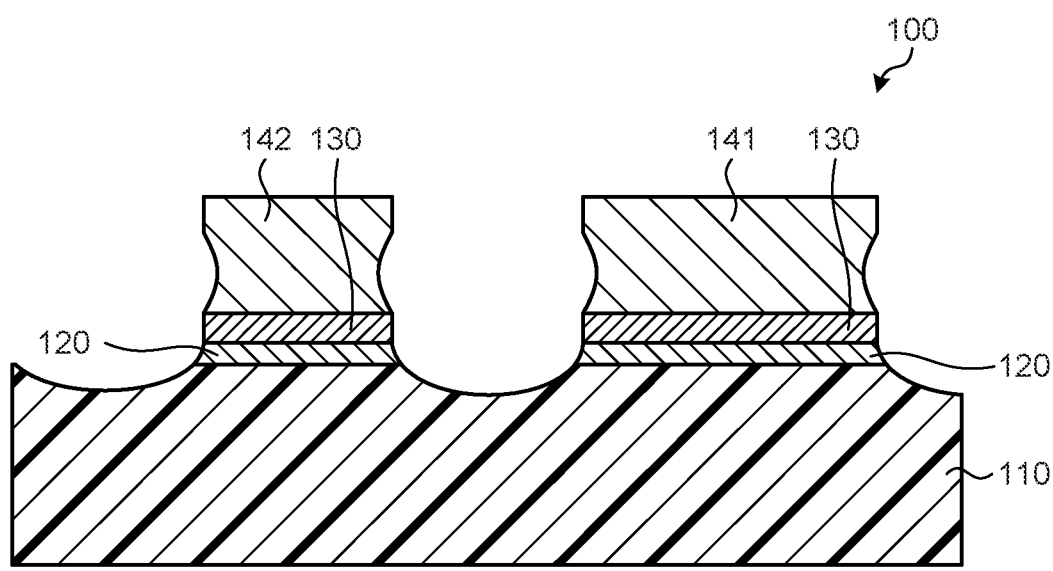
FIG. 1 is a cross-sectional view illustrating a configuration of a wiring board according to a first embodiment.

FIG. 1 is a cross-sectional view illustrating a configuration of a wiring board 100 according to a first embodiment. FIG. 1 illustrates a cross section of a surface of the wiring board 100 on which electrodes containing wirings are formed and the vicinity of the surface. The wiring board 100 illustrated in FIG. 1 includes an insulating layer 110, an oxide film 120, a seed layer 130, and electrodes 141 and 142.

The insulating layer 110 is, for example, a base material of the wiring board 100 that is formed using insulating resin, such as polyimide. The insulating layer 110 may be one obtained by impregnating inorganic material fillers or glass fibers with epoxy resin, one obtained by impregnating paper with phenol resin, or Teflon (trademark). The insulating layer 110 has a thickness of, for example, approximately 50 µm The oxide film 120 is an insulating film that is formed on a surface of the insulating layer 110 and is a layer that increases adhesion of the seed layer 130 to the insulating layer 110. The oxide film 120 is formed by a film formation technique, such as plasma CVD (Chemical Vapor Deposition) or ALD (Atomic Layer Deposition) using oxide of metal or semimetal, and the oxide film 120 can have a thickness of, for example, 1 to 500 nm, more preferably, 1 to 100 nm. The oxide film 120 is, for example, a film that is formed by ALD and thus the oxide film 120 has a high adhesion strength to the insulating layer 110 and has high adherence to a stereoscopic structure, such as a through hole and side walls. As a result, even when a reliability test in which the wiring board 100 is under a condition of a high temperature and a high humidity as in HAST (Highly Accelerated Stress Test), it is possible to inhibit decrease or adhesion of the seed layer 130 to the insulating layer 110.

It is preferable to use, as a material of the oxide film 120, for example, hafnium oxide (hafnia), titanium oxide (titania), zirconium oxide (zirconia), niobium pentoxide, or the like. Vanadium pentoxide, chrome oxide, aluminum oxide (alumina), silicon oxide, indium oxide, tin oxide, antimony oxide, or the like, is also usable as a material of the oxide film 120.

The oxide film 120 is formed on the surface of the insulating layer 110 in positions in which the electrodes 141 and 142 are formed and the oxide film 120 is removed between the electrodes 141 and 142. Specifically, after the seed layer 130 is etched, the oxide film 120 is dry etched by, for example, argon reverse sputtering, ion trimming, laser processing, or the like, and is removed from an area not overlapping the electrodes 141 and 142. As a result, the insulating layer 110 is exposed in the area between the electrodes 141 and 142.

Accordingly, residue of the seed layer 130 remaining on the surface of the oxide film 120 is removed together with the oxide film 120 the area between the electrodes 141 and 142, which makes it possible to prevent short circuit between the electrodes 141 and 142 and decrease in reliability. The oxide film 120 is a film that is made of insulating oxide and therefore, even when residue of the oxide film 120 remains on the surface of the insulating layer 110, short circuit between the electrodes 141 and 142 and decrease in reliability do not occur.

Furthermore, as described above, because removal of the oxide film 120 is performed by, for example, dry etching, such as argon reverse sputtering, it is possible to inhibit side etching of the seed layer 130 and the electrodes 141 and 142 and reduce damage of the surface of the insulating layer 110 that is exposed in the area not overlapping the electrodes 141 and 142.

The seed layer 130 is a conductive layer that is formed on the surface of the oxide film 120 and that serves as a cathode with respect to the electrodes 141 and 142. The seed layer 130 is formed, for example, by sputtering using metal, such as copper, and the seed layer 130 can have a thickness of, for example, 30 to 3000 nm.

The electrodes 141 and 142 serve as wirings and electrodes that are formed on the wiring board 100 and are formed on a surface of the seed layer 130 by, for example, electrolytic copper plating. The electrodes 141 and 142 can have a height of, for example, 1 to 500 µm from the surface of the seed layer 130. The electrodes 141 and 142 are adjacent to each other and, because the oxide film 120 and the seed layer 130 are removed in the area between the electrodes 141 and 142, the electrodes 141 and 142 are insulated.

Figure 2:
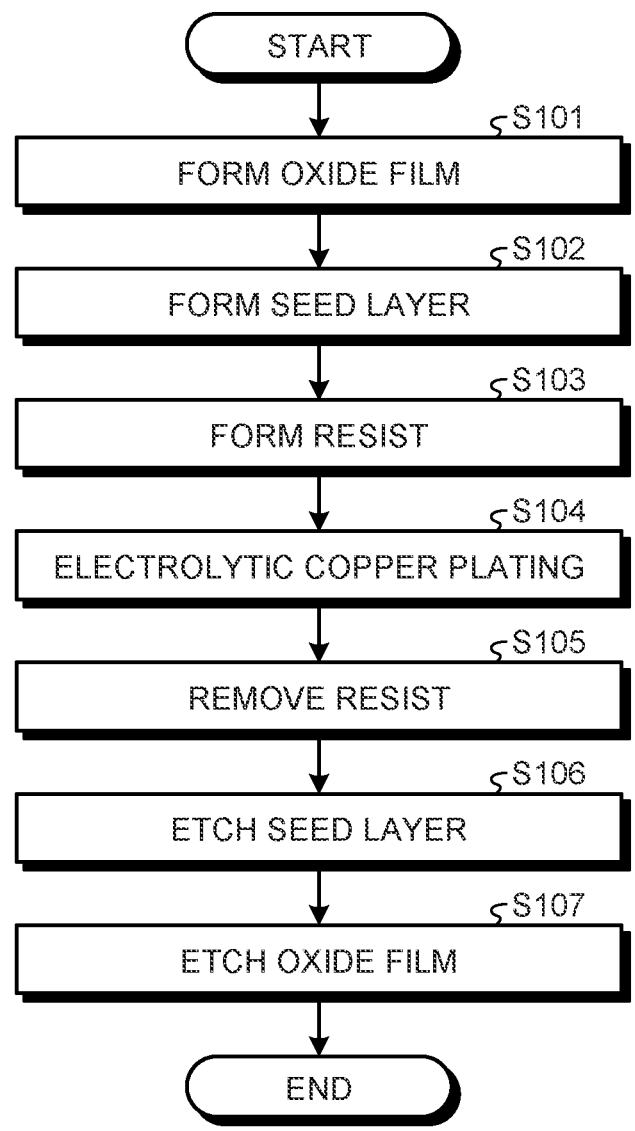
FIG. 2 is a flowchart illustrating a method of manufacturing a wiring board according to the first embodiment.

A method of manufacturing the wiring board 100 that is configured as described above will be described next with reference to the flowchart in FIG. 2, taking an example specifically.

Figure 3:
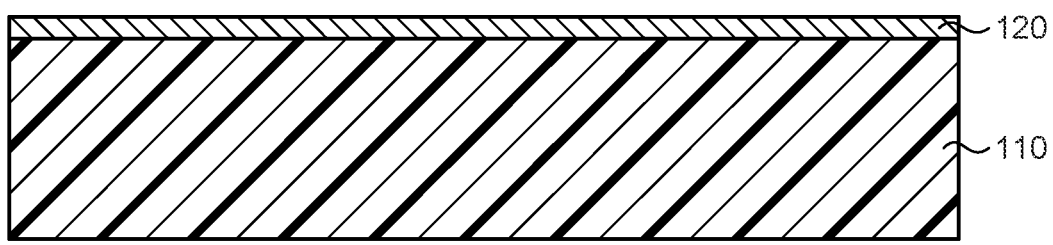
FIG. 3 is a diagram illustrating a specific example of a process of forming an oxide film.

First of all, the oxide film 120 is formed by a film formation technique, such as ALD, on the surface of the insulating, layer 110 made of, for example, polyimide (step S101). Specifically, as illustrated in FIG. 3, the oxide film 120 having a thickness of 1 to 500 nm is formed on the surface of the insulating layer 110 having a thickness of approximately 50 µm. The oxide film 120 is made of, for example, metal or semimetal oxide, such as hafnium oxide (hafnia), titanium oxide (titania), zirconium oxide (zirconia) or niobium pentoxide, and is formed by a film formation technique, such as ALD enabling formation of a film. Forming the oxide film 120 by ALD makes it possible to inhibit decrease in strength of adhesion of the oxide film 120, for example, even after a reliability test, such as HAST.

Figure 4:
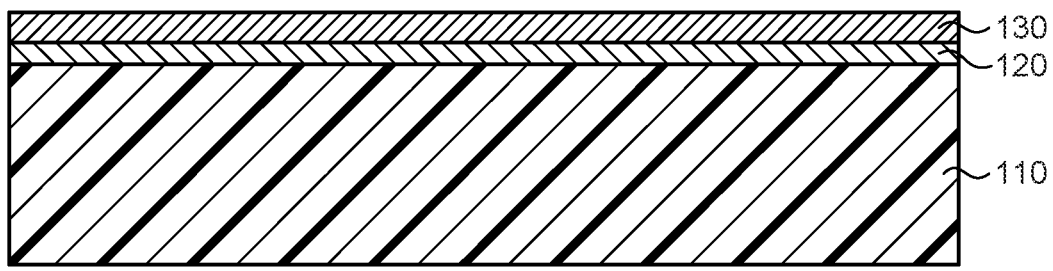
FIG. 4 is a diagram illustrating a specific example of a step of forming a seed layer.

The seed layer 130 is then formed by sputtering on the surface of the oxide film 120 (step S102). In other words, for example, as illustrated in FIG. 4, the seed layer 130 having a thickness of 30 to 3000 nm is formed on the surface of the oxide film 120 by, for example, copper sputtering.

Figure 5:
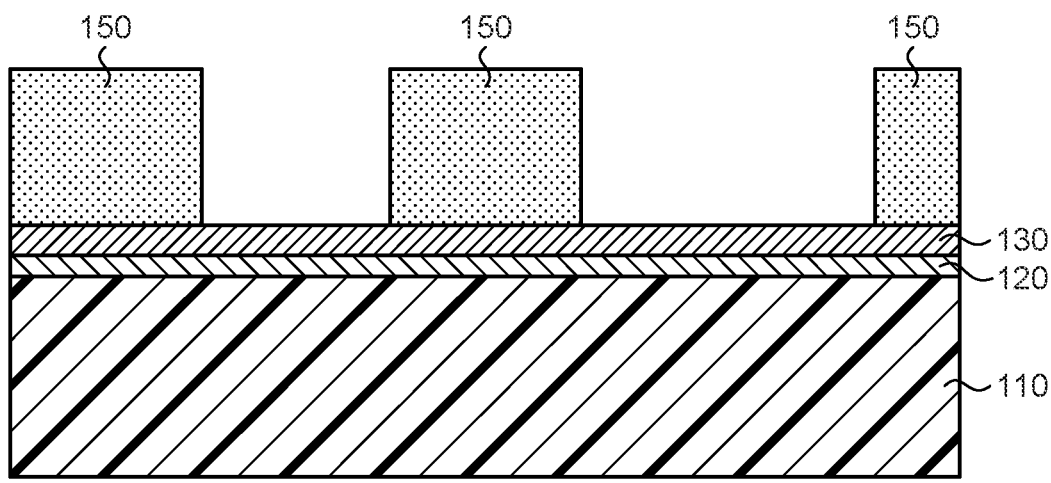
FIG. 5 is a diagram illustrating a specific example of a step of forming a resist.
Figure 6:
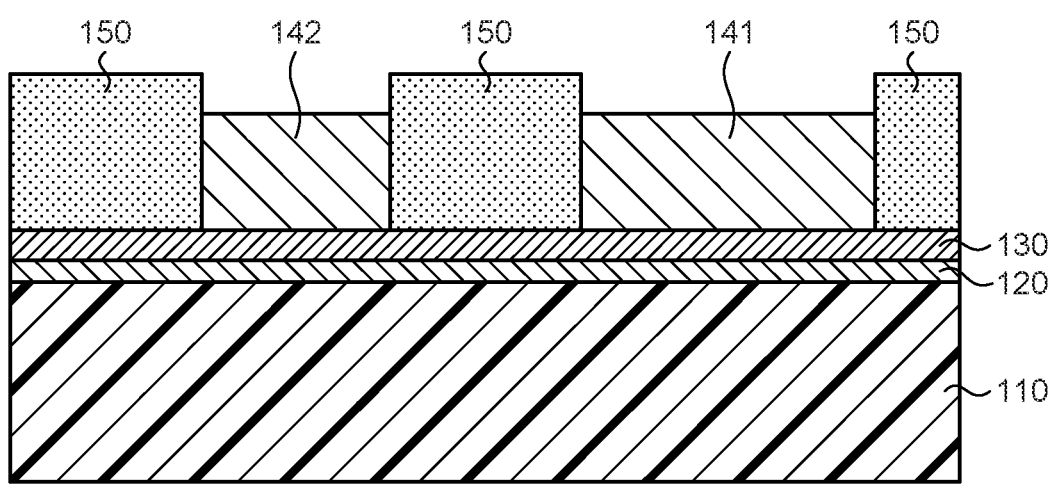
FIG. 6 is a diagram illustrating a specific example of a step of electrolytic copper plating.

After the seed layer 130 is formed, a resist is formed on an area excluding areas in which electrodes containing wirings are to be formed (step S103). In other words, for example, as illustrated in FIG. 5, a resist 150 having openings in areas in which the electrodes 141 and 142 are to be formed is formed. Using the resist 150 as a mask, for example, for example, electrolytic copper plating is performed (step S104). In other words, for example, as illustrated in FIG. 6, copper is stacked in the openings of the resist 150, so that the electrodes 141 and 142 are formed.

Figure 7:
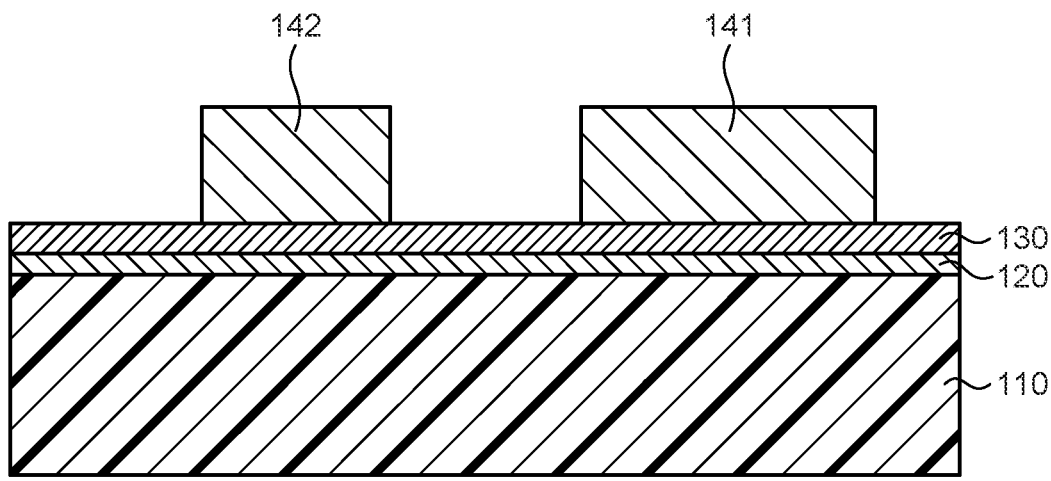
FIG. 7 is a diagram illustrating a specific example of a step of removing the resist.
Figure 8:
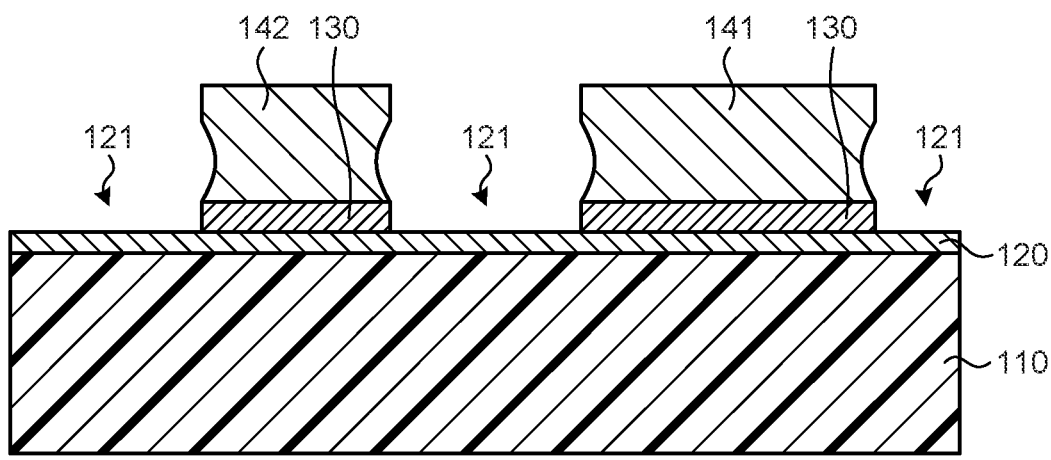
FIG. 8 is a diagram illustrating a specific example of a step of etching the seed layer.

After the electrodes 141 and 142 are formed, the resist 150 is removed (step S105) and, for example, as illustrated in FIG. 7, an intermediate structure having the electrodes 141 and 142 on the oxide film 120 and the seed layer 130 that are stacked on the insulating layer 110 is obtained. In the intermediate structure, the adjacent electrodes 141 and 142 are short-circuited via the seed layer 130 that is a conductor and thus the seed layer 130 in the area between the electrodes 141 and 142 is removed by copper etching (step 3106). In other words, for example, as illustrated in FIG. 8, the intermediate structure is immersed in a copper etching solution (etching solution A) using the electrodes 141 and 142 as an etching mask, so that the seed layer 130 in an area 121 not overlapping the electrodes 141 and 142 is removed. For example, a solution obtained by mixing sulfuric acid and hydrogen peroxide as main components is usable as the copper etching solution (etching solution A).

Wet etching in which the intermediate structure is immersed in the copper etching solution (etching solution A) is performed and thus side etching in which side surfaces of the electrodes 141 and 142 formed and made of copper are etched occurs. For this reason, it is preferable that the time during which the intermediate structure is immersed in the etching solution (etching solution A) would not be excessively long to inhibit side etching. As a result, residue of the seed layer 130 may remain in the area 121 but the residue is removed simultaneously with the following etching of the oxide film 120.

In other words, after the wet etching of the seed layer 130, for example, the oxide film 120 in the area 121 is removed by dry etching, such as argon reverse sputtering (step S107). The oxide film 120 is removed and accordingly the residue of the seed layer 130 remaining on the surface of the oxide film 120 is removed simultaneously and the insulating layer 110 is exposed in the area between the electrodes 141 and 142. As a result, it is possible to prevent short circuit between the electrodes 141 and 142 and decrease reliability resulting from residue of the seed layer 130. Furthermore, because dry etching, such as argon reverse sputtering, is performed, side etching of the seed layer 130 and the electrodes 141 and 142 is inhibited, which reduces damage of the side surfaces of the seed layer 130 and the electrodes 141 and 142. Furthermore, different from wet etching in which the insulating layer 110 is immersed in the etching solution, dry etching, such as argon reverse sputtering, enables reduction of damage of the surface of the insulating layer 110 that is exposed in the area not overlapping the electrodes 141 and 142.

As described above, according to the first embodiment, the insulating oxide film is formed as an adhesion layer on the surface of the insulating layer, the seed layer is formed on the surface of the oxide film, and the electrodes are formed on the seed layer. After the seed layer in the area not overlapping the electrodes is removed, the oxide film is removed by dry etching. Thus, even when residue of the seed layer remains in the area in which the electrodes are not formed, the residue is removed together with the oxide film, which makes it possible to prevent short circuit between the adjacent electrodes and decrease in reliability. Furthermore, because the oxide film is removed by dry etching, such as argon reverse sputtering, it is possible to inhibit side etching of the seed layer and the electrodes and reduce damage of the surface of the insulating layer more than when the residue is removed by performing reverse sputtering simply.

[b] Second Embodiment

Figure 9:
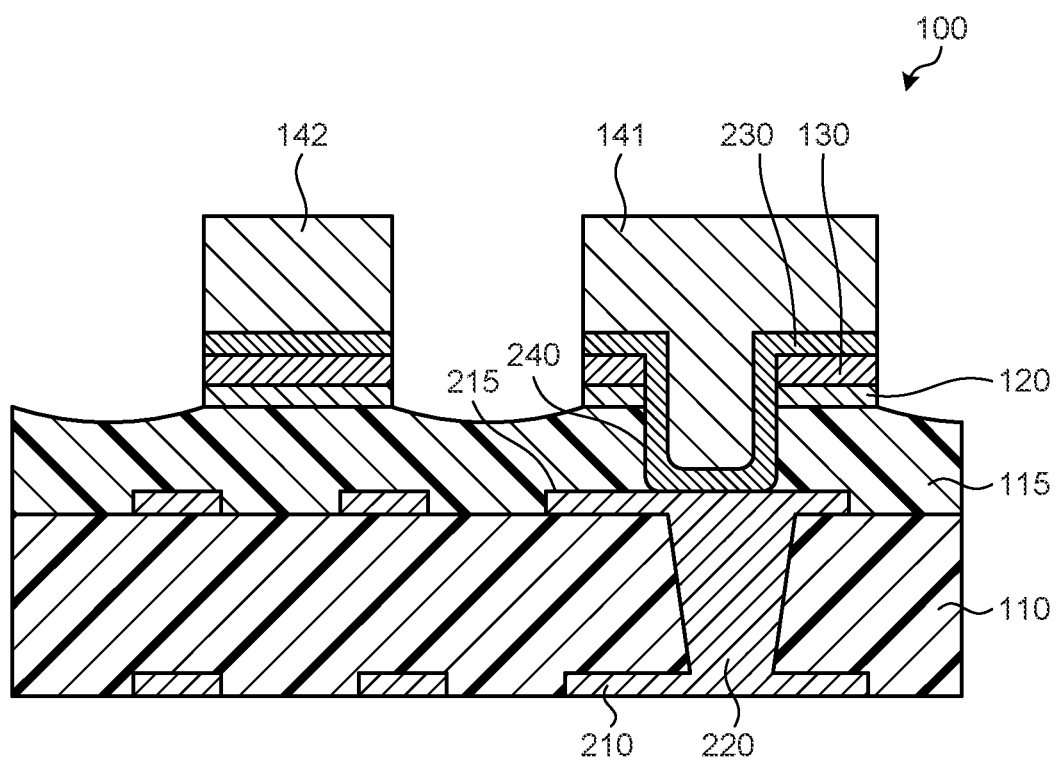
FIG. 9 is a cross-sectional view illustrating a configuration of a wiring board according to a second embodiment.
Figure 10:
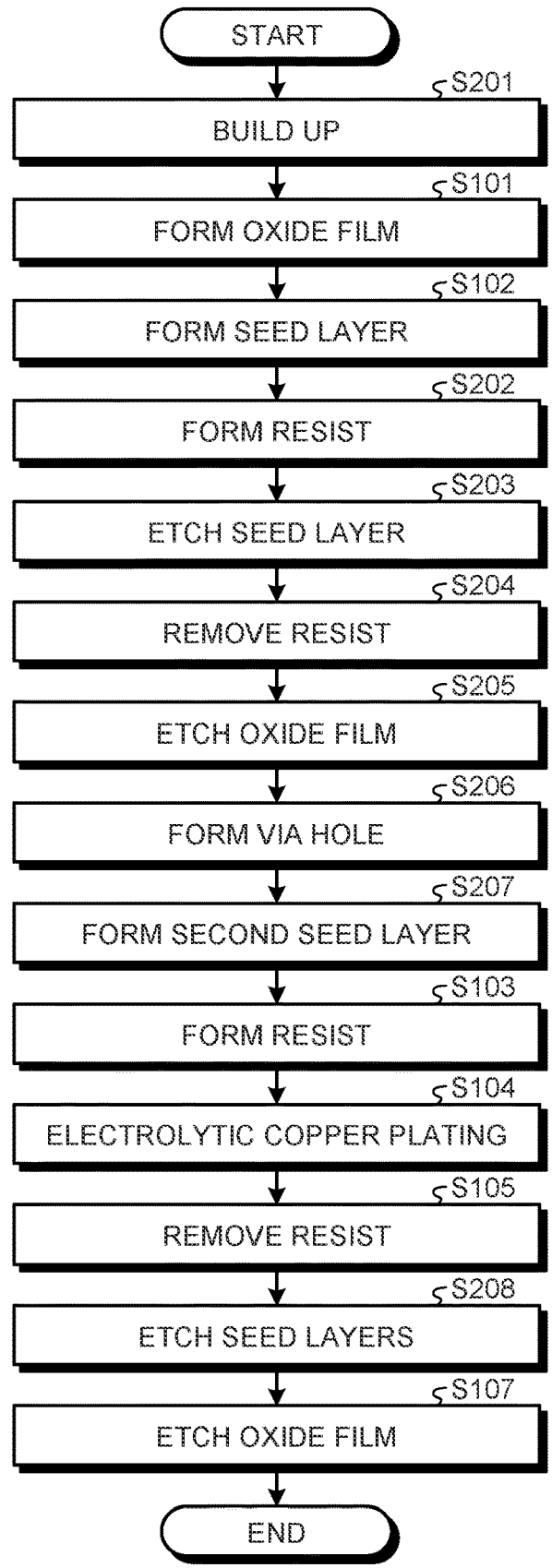
FIG. 10 is a flowchart illustrating a method of manufacturing a wiring board according to the second embodiment.

FIG. 9 is a cross-sectional view illustrating a configuration of the wiring board 100 according to a second embodiment. In FIG. 9, the same components as those in FIG. 10 are denoted with the same reference numbers. FIG. 9 illustrates a cross section of a surface of the wiring board 100 on which electrodes containing wirings are formed and the vicinity of the surface. The wiring board 100 illustrated in FIG. 9 includes the insulating layer 110, an insulating layer 115, the oxide film 120, the seed layer 130, the electrodes 141 and 142, conductive layers 210 and 215, a via 220, second seed layer 230, and a via 240.

The wiring board 100 according to the second embodiment is a multi-layer board obtained by layering the multiple insulating layers 110 and 115 and the multiple conductive layers 210 and 215. Under the conductive layer illustrated in FIG. 9, another insulating layer and another conductive layer may be further stacked.

The insulating layers 110 and 115 are insulating layers that are made of, for example, insulating resin, such as polyimide. The insulating layer 110 covers the conductive layer 210 that is formed on a surface of a lower insulating layer and the conductive layer 215 is formed on a surface of the insulating layer 110. The conductive layer 215 is covered with the insulating layer 115. As described above, the wiring board 100 has a build-up layer obtained by stacking the insulating layers 110 and 115 and the conductive layers 210 and 215.

The conductive layers 210 and 215 are formed on upper surfaces of the respective insulating layers by, for example, patterning metal, such as copper. The conductive layers 210 and 215 that are formed on the upper surfaces of the insulating layers that are different from each other are electrically connected via the via 220 that penetrates the insulating layer 110. The conductive layer 215 that is formed on the upper surface of the insulating layer 110 and the electrode 141 that is formed on the upper surface of the insulating layer 115 are electrically connected via the via 240 that penetrates the insulating layer 115.

The oxide film 120 is an insulating film that is formed on a surface of the insulating layer 115 and is a layer that increases adhesion of the seed layer 130 to the insulating layer 115. The oxide film 120 is formed by a film formation technique, such as plasma CVD or ALD using metal or semimetal oxide, and the oxide film 120 can have a thickness of, for example, 1 to 500 nm. The oxide film 120 is a film that is formed by, for example, ALD and thus the oxide film 120 has a high strength of adhesion to the insulating layer 115 and, even when a reliability test in which the wiring board 100 is under a condition of a high temperature and a high humidity as in HAST, it is possible to inhibit decrease of adhesion of the seed layer 130 to the insulating layer 115.

It is preferable to use, as a material of the oxide film 120, for example, hafnium oxide (hafnia), titanium oxide (titania), zirconium oxide (zirconia), niobium pentoxide, or the like. Vanadium pentoxide, chrome oxide, aluminum oxide (alumina), silicon oxide, indium oxide, tin oxide, antimony oxide, or the like, is also usable as a material of the oxide film 120.

The oxide film 120 is formed on the surface of the insulating layer 115 in positions in which the electrodes 141 and 142 are formed and the oxide film 120 is removed between the electrodes 141 and 142. In the second embodiment, the oxide film 120 is removed also in the position of the via 240. Specifically, after the seed layer 130 is etched, the oxide film 120 dry etched by, for example, argon reverse sputtering, ion trimming, laser processing, or the like, and is removed from an area between the electrodes 141 and 142 and an area in which the via 240 is formed.

The seed layer 130 is a conductive layer that is formed on the surface of the oxide film 120 and that serves as a cathode with respect to the electrodes 141 and 142. The seed layer 130 is formed by, for example, sputtering using metal, such as copper, and the seed layer 130 can have a thickness of, for example, 30 to 3000 nm.

The electrodes 141 and 142 serve as wirings and electrodes that are formed on the surface of the wiring board 100 and the electrodes 141 and 142 are formed on the surface of the second seed layer 230 by, for example, electrolytic copper plating. The electrodes 141 and 142 can have a height of, for example, 1 to 500 μm from the surface of the second seed layer 230. The electrodes 141 and 142 are adjacent to each other and, because the oxide film 120, the seed layer 130, and the second seed layer 230 are removed the area between the electrodes 141 and 142, the electrodes 141 and 142 are insulated. The electrode 141 is electrically connected to the conductive layer 215 via the via 240.

The second seed layer 230 is a conductive layer that is formed on a surface of the seed layer 130 and the an outer circumference of the via 240 and that serves as a cathode together with the seed layer 130 with respect to the electrodes 141 and 142. Like the seed layer 130, the second seed layer 230 is formed by, for example, sputtering using metal, such as copper.

Because of formation of the second seed layer 230 and the electrode 141 in the via hole penetrating the insulating layer 115, the via 240 electrically connects the electrode 141 and the conductive layer 215. In other words, the second seed layer 230 that is formed on the inner surface of the via hole makes contact with the conductive layer 215 and the electrode 141 extends to the inner concave of the second seed layer 230.

A method of manufacturing the wiring board 100 that is configured as described above will be described next with reference to the flowchart in FIG. 10, taking an example specifically. In FIG. 10, the same components as those in FIG. 2 are denoted with the same reference numbers.

Figure 11:
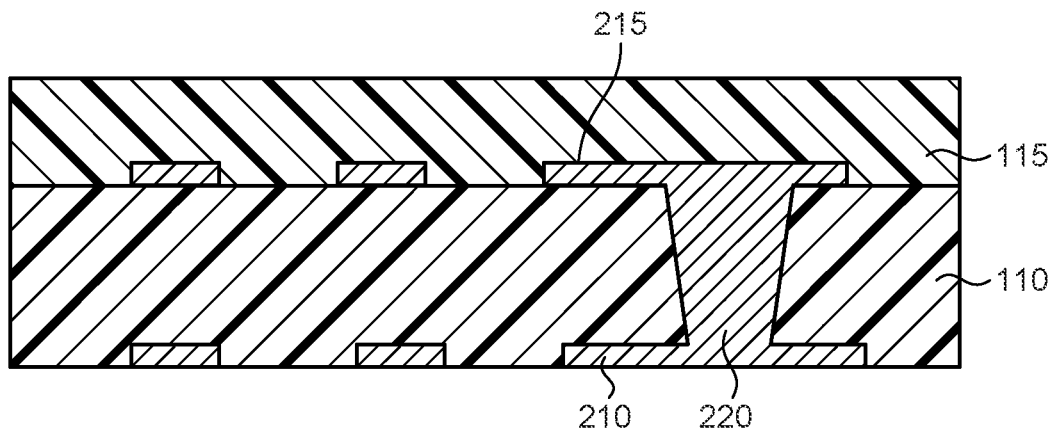
FIG. 11 is a diagram illustrating a specific example of a build-up step.

First of all, a build-up layer is formed by stacking insulating layers and conductive layers (step S201). Specifically, for example, as illustrated in FIG. 11, after the conductive layer 210 is formed on an upper surface of an insulating layer, the insulating layer 110 is stacked such that the insulating layer 110 covers the conductive layer 210. The via 220 penetrating the insulating layer 110 is then formed and the conductive layer 215 is formed on the upper surface of the insulating layer 110. Furthermore, the insulating layer 115 is stacked such that the insulating layer 115 covers the conductive layer 215.

Figure 12:
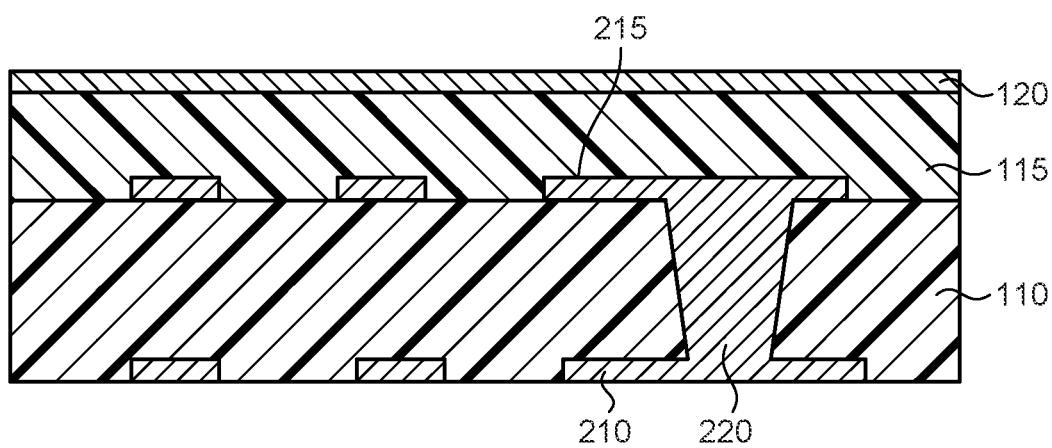
FIG. 12 is a diagram illustrating a specific example of a step of forming an oxide film.

The oxide film 120 is formed by a film formation technique, such as ALD, on the surface of the insulating layer 115 (step S101). Specifically, as illustrated in FIG. 12, the oxide film 120 having a thickness of 1 to 500 nm is formed on the surface of the insulating layer 115 that is the top layer of the build-up layer. The oxide film 120 is made of, for example, metal or semimetal oxide, such as hafnium oxide (hafnia), titanium oxide (titania), zirconium oxide (zirconia) or niobium pentoxide, and is formed by a film formation technique, such as ALD enabling formation of a film. Forming the oxide film 120 by ALD, for example, makes it possible to inhibit decrease in strength of adhesion of the oxide film 120 even after a reliability test, such as HAST.

Figure 13:
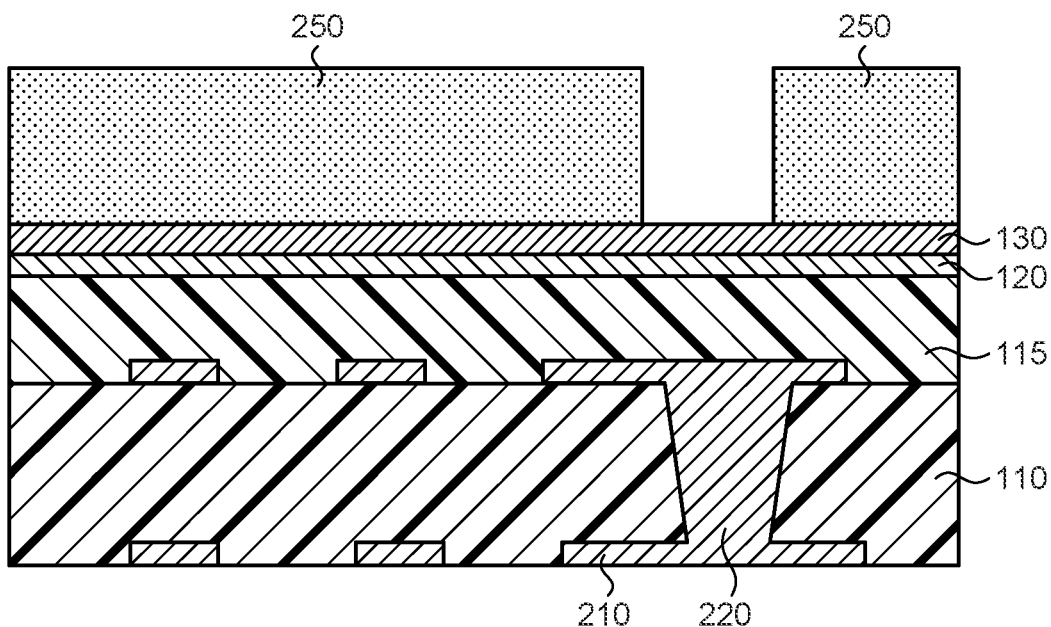
FIG. 13 is a diagram illustrating a specific example of a step of forming a seed layer.

The seed layer 130 is then formed on the surface of the oxide film 120 by sputtering (step S102). Furthermore, a resist is formed on the upper surface of the seed layer 130 in an area excluding the area in which the via 240 is to be formed (step S202). In other words, for example, as illustrated in FIG. 13, the seed layer 130 having a thickness of 30 to 3000 nm is formed on the surface of the oxide film 120 by, for example, copper sputtering. Thereafter, a resist 250 having an opening in the area in which the via 240 is to be formed is formed.

Figure 14:
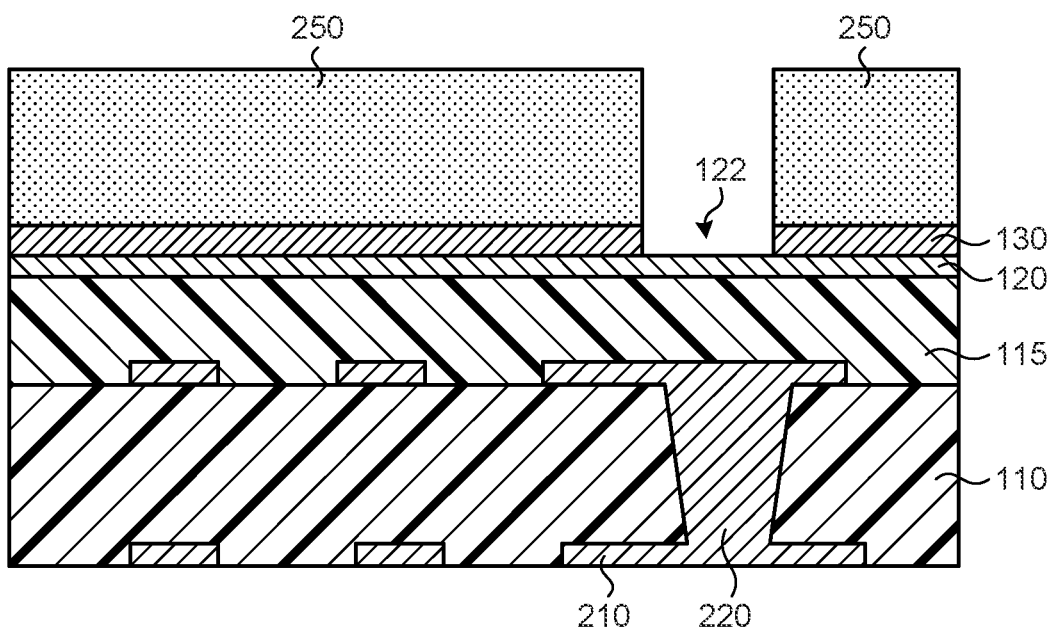
FIG. 14 is a diagram illustrating a specific example of a step of etching the seed layer.

The seed layer 130 is then etched, using the resist 250 as an etching mask (step S203). Specifically, for example, as illustrated in FIG. 14, the seed layer 130 in the opening of the resist 250 is removed and the oxide film 120 is exposed in an area 122 in which the via 240 is to be formed.

Figure 15:
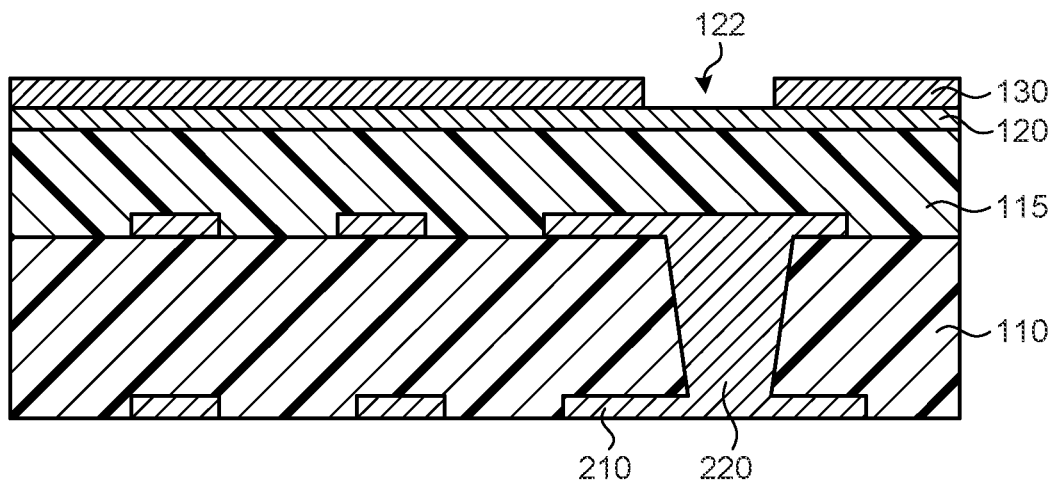
FIG. 15 is a diagram illustrating a specific example of a step of removing a resist.
Figure 16:
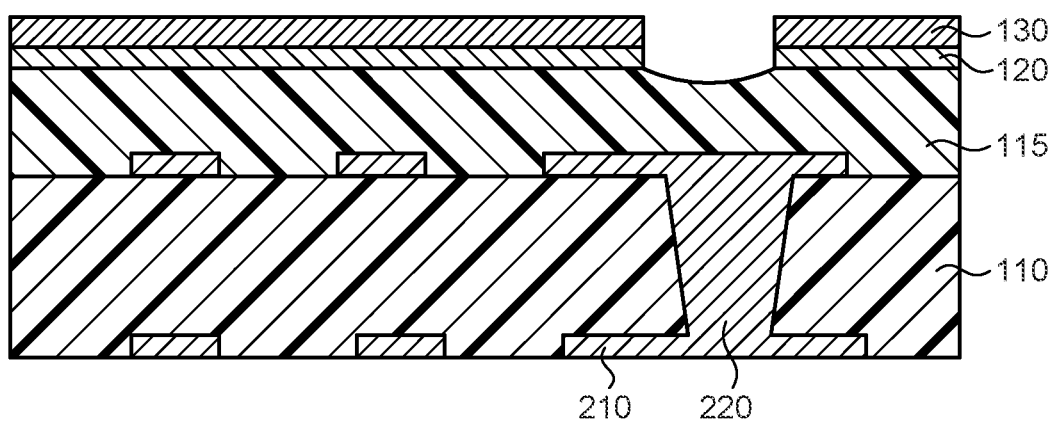
FIG. 16 is a diagram illustrating a specific example of a step of etching the oxide film.

After the seed layer 130 in the area 122 is removed, the resist 250 is removed (step S204) and, as illustrated in FIG. 15, the oxide film 120 is exposed in the area 122 and the oxide film 120 is covered with the seed layer 130 in the area excluding the area 122. Thus, the oxide film 120 is etched, sing the seed layer 130 as an etching mask (step S205). Specifically, for example, as illustrated FIG. 16, the oxide film 120 in the area 122 is removed by, for example, dry etching, such as argon reverse sputtering. Dry etching, such as argon reverse sputtering, is performed and accordingly only the oxide film 120 is removed, which makes it possible to reduce damage of the seed layer 130 and the insulating layer 115.

Figure 17:
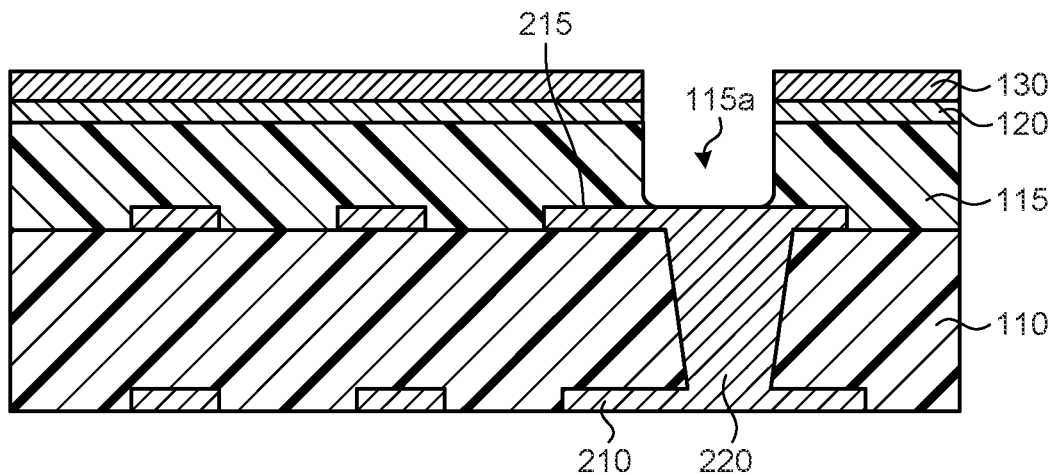
FIG. 17 is a diagram illustrating a specific example of a step of forming a via hole.

For example, anisotropic etching or laser processing is performed on the insulating layer 115 that is exposed because of removal of the oxide film 120, so that a via hole that penetrates the insulating layer 115 is formed (step S206). In other words, as illustrated in FIG. 17, in the area in which the oxide film 120 and the seed layer 130 are removed, a via hole 115a is formed in the insulating layer 115. The via hole 115a penetrates the insulating layer 115 and reaches the conductive layer 215 and the conductive layer 215 is exposed at the bottom surface of the via hole 115a.

Figure 18:
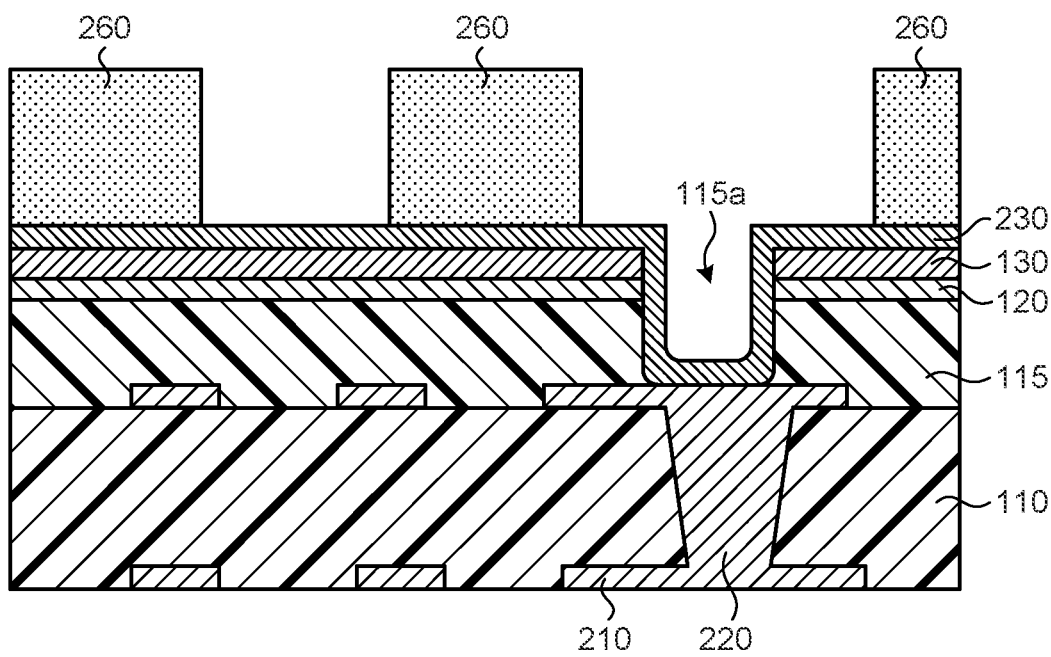
FIG. 18 is a diagram illustrating a specific example of a step of forming a second seed layer.

After the via hole 115a is formed, the second seed layer 230 is formed by sputtering on the upper surface of the seed layer 130 and the inner surface of the via hole 115a (step S207). On the upper surface of the second seed layer 230, a resist is formed in the area excluding areas in which electrodes containing wirings are to be formed (step S103). In other words, for example, as illustrated in FIG. 18, the second seed layer 230 having a thickness of 30 to 3000 nm is formed by, for example, copper sputtering on the surface of the seed layer 130 and the inner surface of the via hole 115a. Thereafter, a resist 260 having openings in the areas in which the electrodes 141 and 142 are to be formed is formed.

Figure 19:
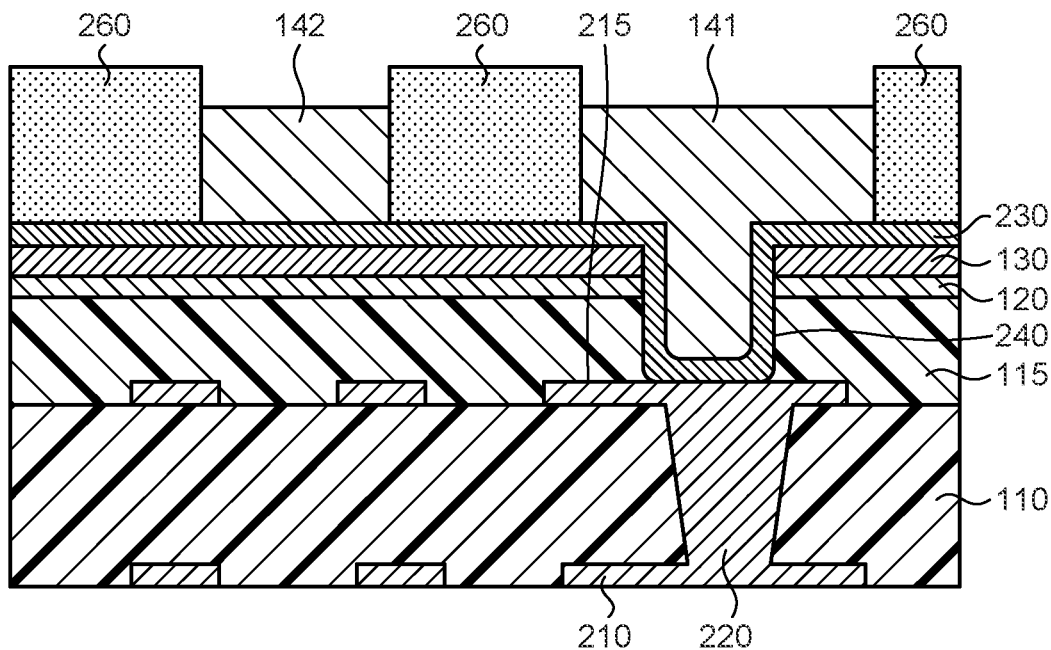
FIG. 19 is a diagram illustrating a specific example of a step of electrolytic copper plating.

Using the resist 260 as a mask, for example, electrolytic copper plating is performed (step S104). In other words, for example, as illustrated in FIG. 19, copper is stacked in the openings of the resist 260 and the electrodes 141 and 142 are formed. In this case, the electrode 141 extends to the inner concave of the second seed is 230 that is formed on the inner surface of the via hole 115a and the via 240 that electrically connects the electrode 141 and the conductive layer 215 is formed.

Figure 20:
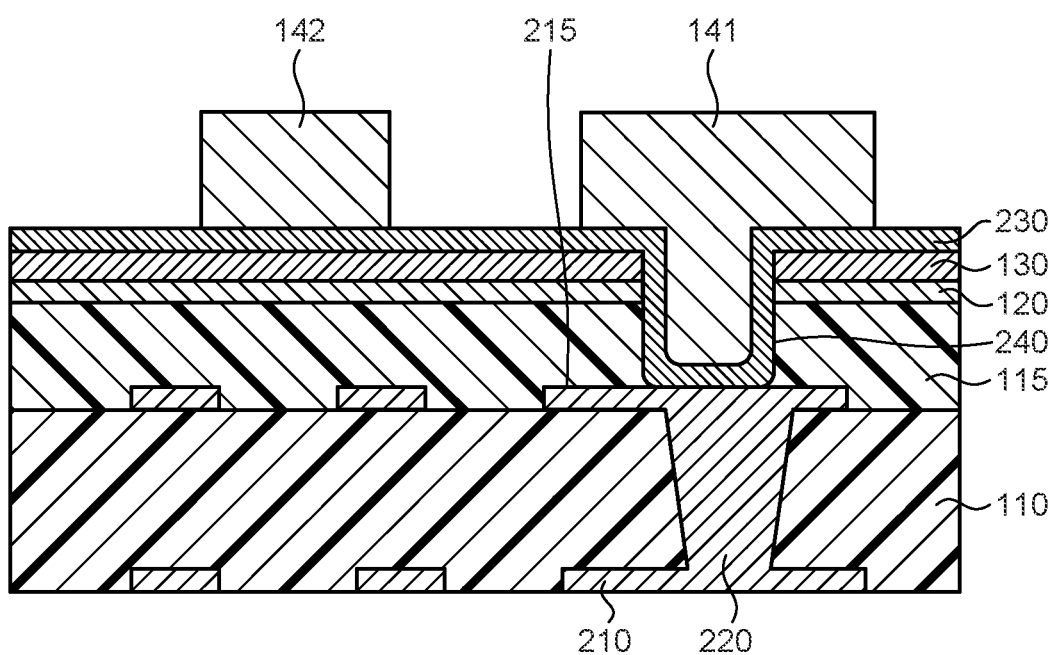
FIG. 20 is a diagram illustrating a specific example of a step of removing a resist.
Figure 21:
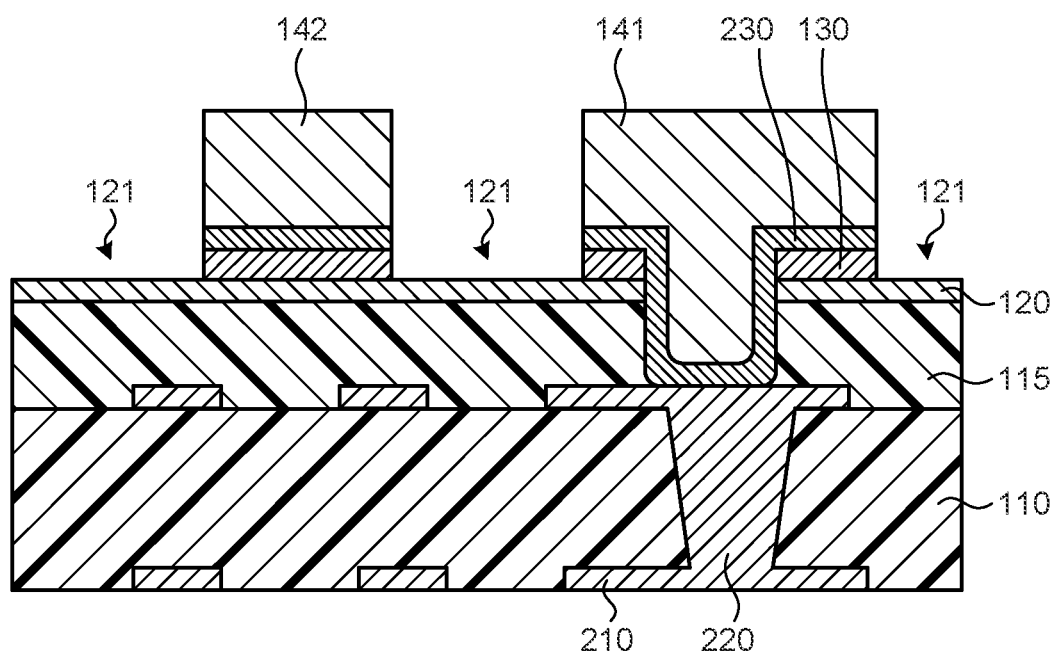
FIG. 21 is a diagram illustrating a specific example of a step of etching the seed layer.

After the electrodes 141 and 142 are formed, the resist 260 is removed (step S105) and, for example, as illustrated in FIG. 20, an intermediate structure including the electrodes 141 and 142 on the oxide film 120, the seed layer 130, and the second seed layer 230 that are stacked on the surface of the insulating layer 115 and including the via 240 that connects the electrode 141 and the conductive layer 215 is obtained. In the intermediate structure, the adjacent electrodes 141 and 142 are short-circuited via the seed layer 130 and the second seed layer 230 that are conductors and thus the seed layer 130 and the second seed layer 230 in the area between the electrodes 141 and 142 are removed by copper etching (step S208). In other words, for example, as illustrated in FIG. 21, the intermediate structure is immersed in a copper etching solution, using the electrodes 141 and 142 as an etching mask, so that the seed layer 130 and the second seed layer 230 in the area 121 not overlapping the electrodes 141 and 142 are removed.

Wet etching in which the intermediate structure is immersed in the copper etching solution is performed and thus side etching in which side surfaces of the electrodes 141 and 142 formed and made of copper are etched occurs. For this reason, it preferable that the time during which the intermediate structure is immersed in the etching solution would not be excessively long to inhibit side etching. As a result, residue of the seed layer 130 or the second seed layer 230 may remain in the area 121 but the residue is removed also during the following etching of the oxide film 120.

In other words, after wet etching of the seed layer 130 and the second seed layer 230, the oxide film 120 in the area 121 is removed by, for example, dry etching, such as argon reverse sputtering (step S107). The oxide film 120 is removed and accordingly the residue of the seed layer 130 or the second seed layer 230 remaining on the surface of the oxide film 120 is simultaneously removed, which makes it possible to prevent short circuit between the electrodes 141 and 142 and decrease in reliability. Furthermore, because dry etching, such as argon reverse sputtering, is performed, side etching of the seed layer 130, the second seed layer 230 and the electrodes 141 and 142 is inhibited, which makes it possible to reduce damage of the side surfaces of the seed layer 130, the second seed layer 230 and the electrodes 141 and 142. Furthermore, different from wet etching in which the insulating layer 115 is immersed in the etching solution, dry etching, such as argon reverse sputtering, enables decrease of damage of the surface of the insulating layer 115.

As described above, according to the second embodiment, after the oxide film and the seed layer are formed on the surface of the insulating layer, the via is formed by removing the oxide and the seed layer in the position in which the electrode is to be formed and the electrode that is connected to the inter-layer wiring via the via is formed. After the seed layers in the area not overlapping the electrodes are removed, the oxide film is removed by dry etching. Thus, it is possible to manufacture a multi-laver board including an oxide film as an adhesion layer and, even when residue of the seed layer remains in the area in which the electrodes are not formed, the residue is removed together with the oxide film, which makes it possible to prevent short circuit between the adjacent electrodes and decrease in reliability. Furthermore, because the oxide film is removed by dry etching, such as argon reverse sputtering, it is possible to inhibit side etching of the seed layers and the electrodes and more reduce damage of the surface of the insulating layer than when residue of the seed layer is dry etched independently.

[c] Third Embodiment

In the second embodiment, after the oxide film 120 and the seed layer 130 are formed on the surface of the insulating layer 115, the oxide film 120 and the seed layer 130 in the area in which the via 240 is to be formed are removed and the via hole 115a is formed. It is, however, also possible to form the via hole 115a at an early stage before the oxide film 120 and the seed layer 130 are formed. Thus, in the third embodiment, a method of manufacturing the wiring board 100 in the case where the via hole 115a is formed at an initial stage will be described.

Figure 22:
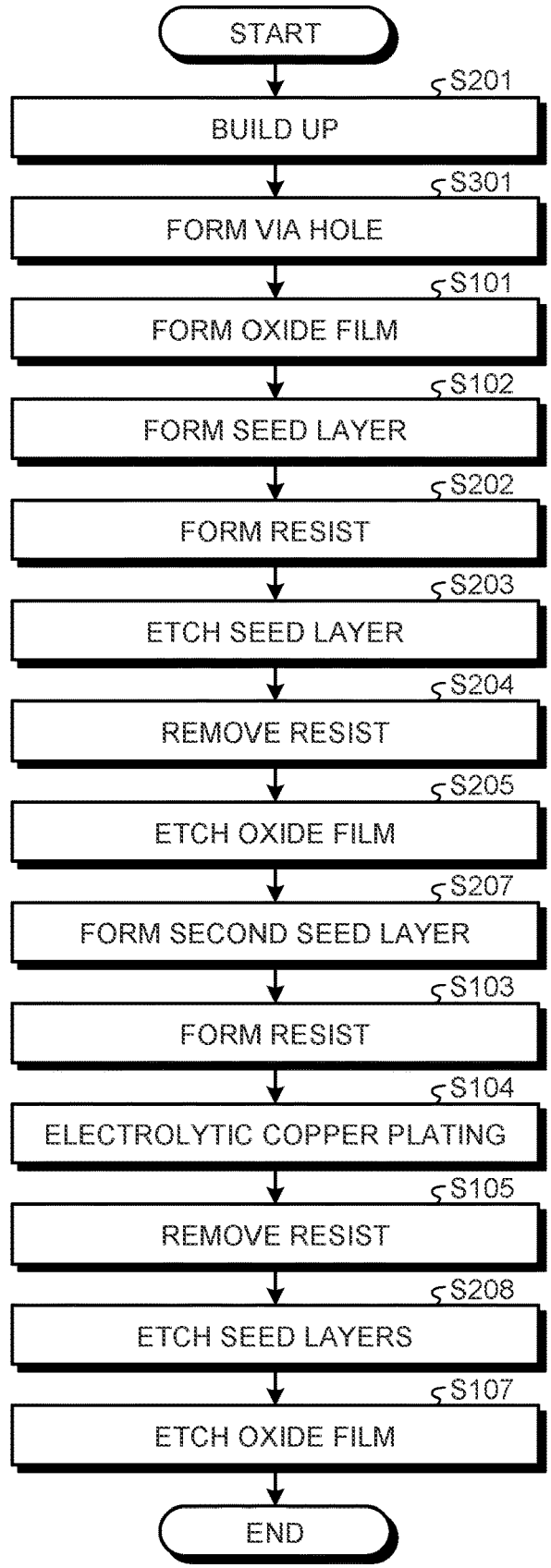
FIG. 22 is a flowchart illustrating a method of manufacturing a wiring board according to a third embodiment.

The configuration of the wiring board 100 according to the third embodiment is the same as that of the second embodiment (FIG. 9) and thus description thereof will be omitted. In the third embodiment, the method of manufacturing the wiring hoard 100 differs from that of the second embodiment. The method of manufacturing the wiring board 100 according to the third embodiment will be described with reference to the flowchart illustrated FIG. 22, taking an example specifically. In FIG. 22, the same components as those in FIG. 2 and FIG. 10 are denoted with the same reference numbers and detailed description will be omitted.

First of all, a build-up layer is formed by stacking insulating layers and conductive layers (step S201). In other words, a build-up layer including the insulating layers 110 and 115 and the conductive layers 210 and 215 that are stacked and including the via 220 that electrically connects the conductive layers 210 and 215 is formed.

Figure 23:
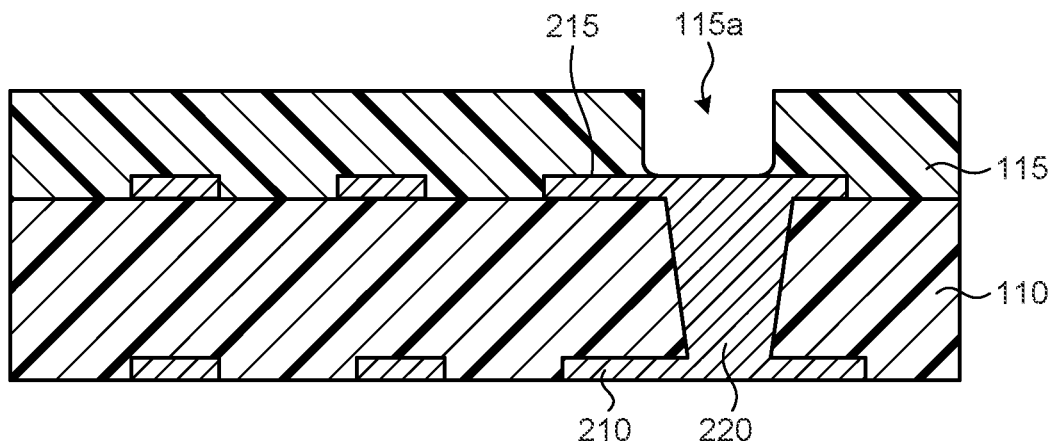
FIG. 23 is a diagram illustrating a specific example of a step of forming a via hole.

For example, anisotropic etching or laser processing is performed on the insulating layer 115 that is the top layer of the build-up layer, so that a via hole that penetrates the insulating layer 115 is formed (step S301). In other words, as illustrated in FIG. 23, in the area in which the via 240 is to be formed, the via hole 115a is formed in the insulating layer 115. The via hole 115a penetrates the insulating layer 115 and reaches the conductive layer 215 and the conductive layer 215 is exposed at the bottom surface of the via hole 115a.

Figure 24:
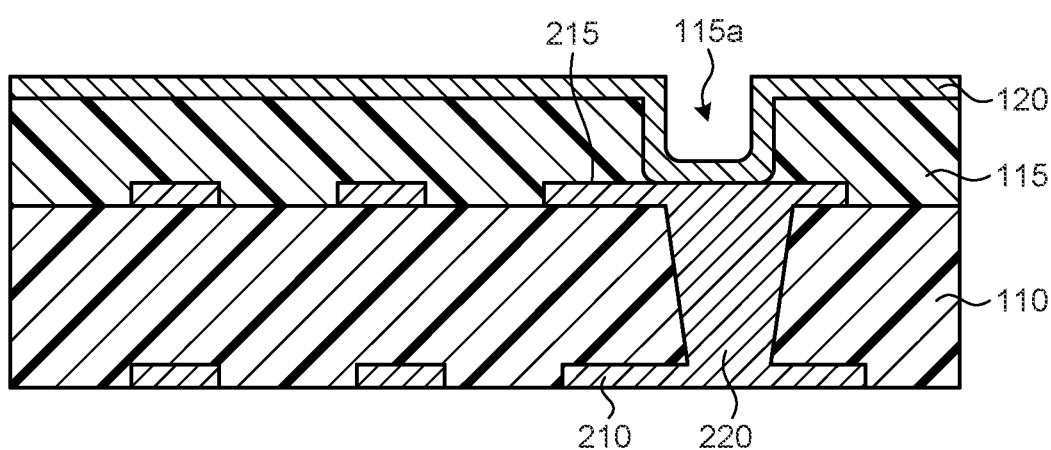
FIG. 24 is a diagram illustrating a specific example of a step of forming an oxide film.

The oxide film 120 is then formed by a film formation technique, such as ALD, on the surface of the insulating layer 115 and the inner surface of the via hole 115a (step S101). Specifically, for example, as illustrated in FIG. 24, the oxide film 120 having a thickness of 1 to 500 nm is formed on the surface of the insulating layer 115 and the inner surface of the via hole 115a. The oxide film 120 is formed by a film formation technique, such as ADD enabling formation of a film, using, for example, metal or semimetal oxide, such as, hafnium oxide (hafnia), titanium oxide (titania), zirconium oxide (zirconia) or niobium pentoxide, as a material. Forming the oxide film 120 by ADD makes it possible to inhibit decrease in strength of adhesion of the oxide film 120, for example, also after a reliability test, such as HAST.

Figure 25:
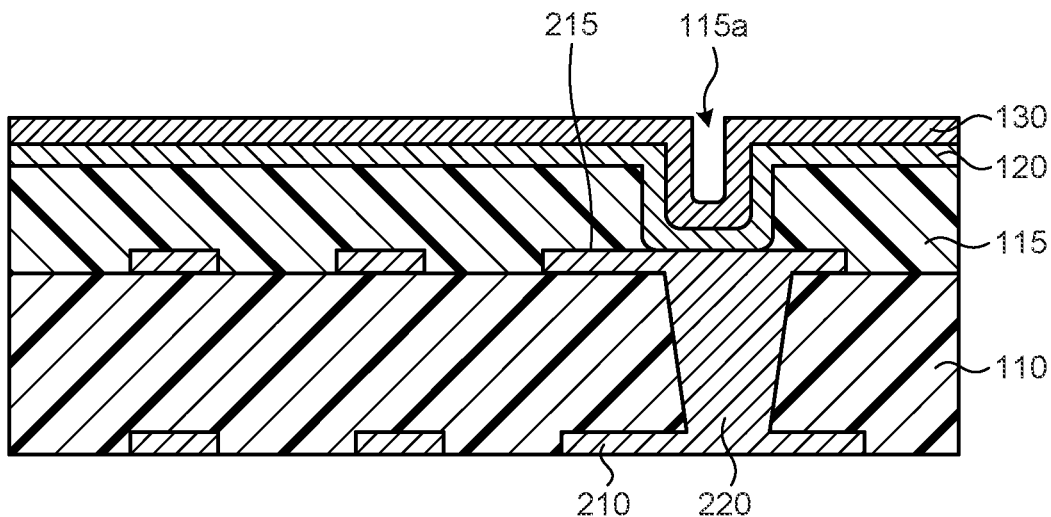
FIG. 25 is a diagram illustrating a specific example of a step of forming a seed layer.

The seed layer 130 is then formed on the surface of the oxide film 120 by sputtering (step 3102). In other words, for example, as illustrated in FIG. 25, the seed layer 130 having a thickness of 30 nm to 3000 nm is formed on the surface of the oxide film 120 by, for example, copper sputtering. In the via hole 115a, because the oxide film 120 and the seed layer 130 are formed along the inner surface of the via hole 115a and the upper surface of the conductive layer 215, the concave is formed.

Figure 26:
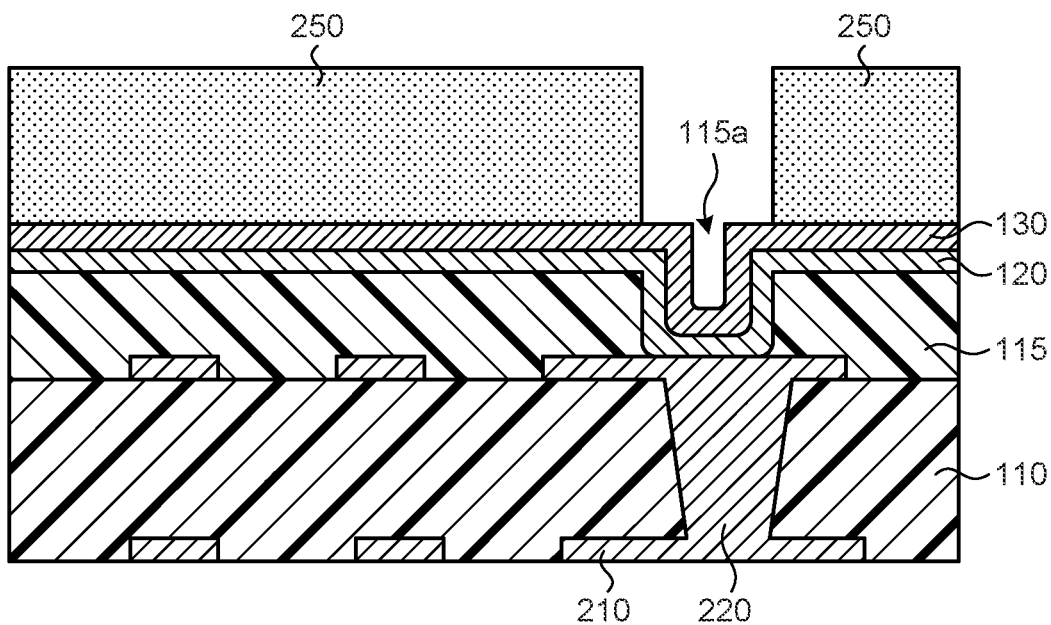
FIG. 26 is a diagram illustrating a specific example of a step of forming a resist.
Figure 27:
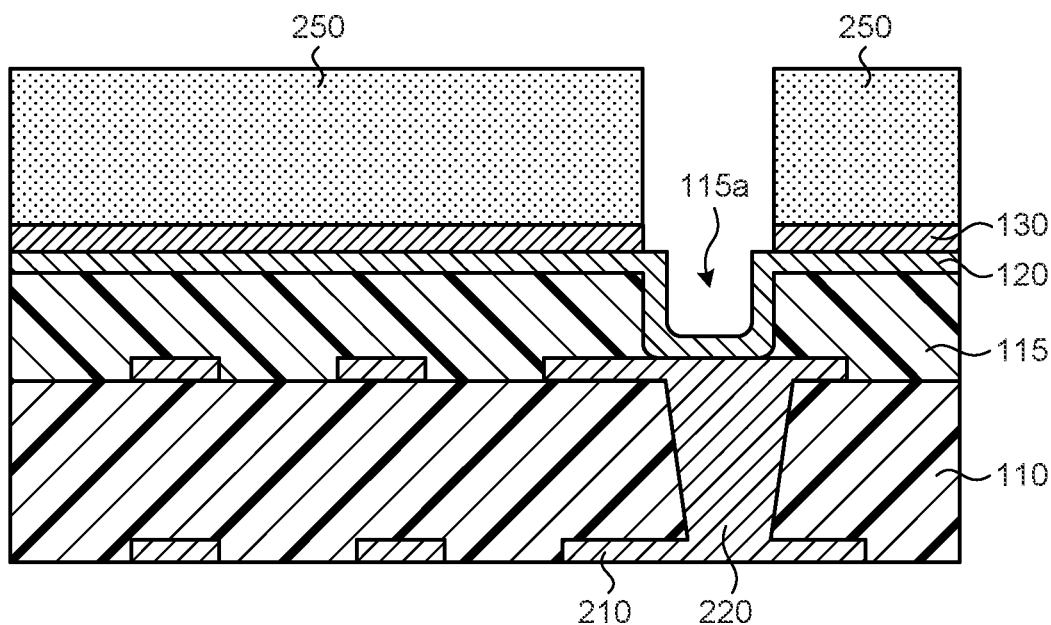
FIG. 27 is a diagram illustrating a specific example of a step of etching the seed layer.

After the seed layer 130 is formed, a resist is formed in an area excluding the area of the via hole 115a on the upper surface of the seed layer 130 (step S202). In other words, for example, as illustrated in FIG. 26, the resist 250 having an opening in the area of the via hole 115a is formed. The seed laser 130 is then etched, using the resist 250 as an etching mask (step S203). Specifically, as illustrated in FIG. 27, the seed layer 130 in the opening of the resist 250 is removed and the oxide film 120 is exposed in the area containing the concave in the via hole 115a.

Figure 28:
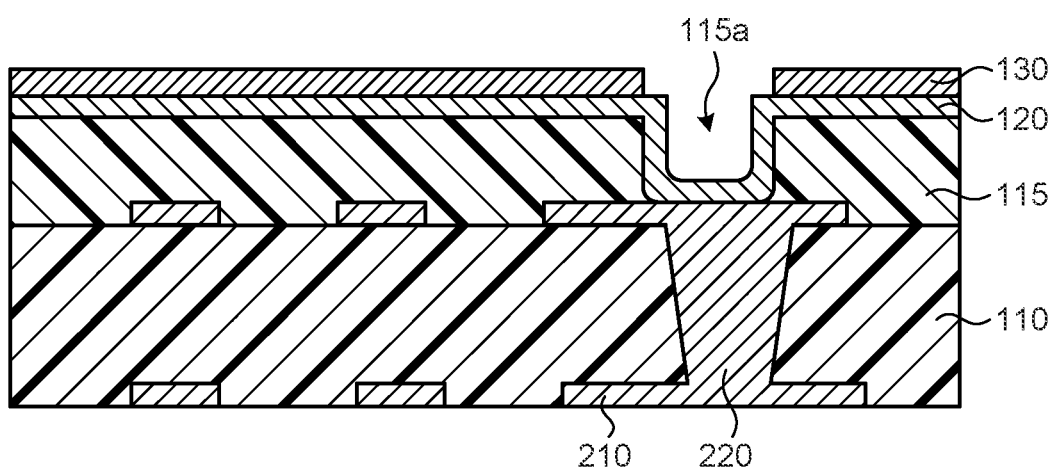
FIG. 28 is a diagram illustrating a specific example of a step removing the resist.

After the seed layer 130 in the area of the via hole 115a is removed, the resist 250 is removed (step S204) and, for example, as is rated FIG. 28, the oxide film 120 is exposed in the area of the via hole 115a and the oxide film 120 is covered with the seed layer 130 in the area other than the area of the via hole 115a. Thus, using the seed layer 130 as an etching mask, the oxide film 120 is etched (step S205). This leads to the same state as the state (FIG. 17) in which the via hole 115a is formed in the second embodiment and accordingly, as in the second embodiment, the electrodes 141 and 142 and the via 240 are formed.

In other words, the second seed layer 230 is formed by sputtering on the upper surface of the seed layer 130 and the inner surface of the via hole 115a (step S207) and a resist is formed in the area excluding the areas in which the electrodes 141 and 142 are to be formed on the upper surface of the second seed layer 230 (step S103). For example, copper plating is performed, using the resist as a mask (step S104), the electrodes 141 and 142 and the via 240 are formed accordingly, and then the resist is removed (step S105). Thereafter the seed layer 130 and the second seed layer 230 in the area not overlapping the electrodes 141 and 142 are removed by copper etching (step S208) and the oxide film 120 in the area not overlapping the electrodes 141 and 142 is removed by, for example, dry etching, such as argon reverse sputtering (step S107).

As described above, according to the third embodiment, after the via hole is formed in the insulating layer, the oxide film and the seed layer are formed on the surface of the insulating layer and the inner surface of the via hole, the oxide film and the seed layer in the area of the via hole are then removed, and the electrodes and the via are formed. After the seed layers in the area not overlapping the electrodes is removed, the oxide film is removed by dry etching. Thus, it is possible to manufacture a multi-layer board including an oxide film as an adhesion layer and, even when residue of the seed layer remains in the area in which no electrode is formed, the residue is removed together with the oxide film and this makes it possible to prevent short circuit between the adjacent electrodes and decrease of reliability. Furthermore, because the oxide film is removed by dry etching, such as argon reverse sputtering, it is possible to inhibit side etching of the seed layers and the electrodes and reduce damage of the surface of the insulating layer.

With respect to the embodiments and the variety thereof described above, the following notes are further disclosed.

(Note 1) A method of manufacturing a wiring board including:
forming an insulating oxide film by forming a film of metal oxide or semimetal oxide on a surface of an insulating layer;
stacking a seed layer made of metal on the insulating oxide film;
forming an electrode that is made of metal on the seed layer,
removing the seed layer from an area not overlapping the electrode; and
removing the insulating oxide film in the area from which the seed layer is removed to expose the insulating layer.

(Note 2) The method according to Note 1, wherein the forming the insulating oxide film includes forming a film of hafnium oxide that is oxide of hafnium.

(Note 3) The method according to Note 2, wherein the forming the insulating oxide film includes forming a film of hafnium oxide that has a thickness of 1 to 100 nm by ALD (Atomic Layer Deposition).

(Note 4) The method according to Note 1, wherein the removing the insulating oxide film includes removing the insulating oxide film by dry etching using the seed layer as an etching mask.

(Note 5) The method according to Note 4, wherein the removing the insulating oxide film includes removing the insulating oxide film by argon reverse sputtering.

(Note 6) The method according to Note 1, further including:
removing the seed layer and the insulating oxide film in a partial area;
forming a via hole that penetrates the insulating layer in the area from which the seed layer and the oxide film are removed; and
forming a second seed layer on a surface of the seed layer and an inner surface of the via hole,
wherein the forming the electrode includes forming the electrode on the second seed layer, and
the removing the seed layer includes removing the seed layer and the second seed layer.

(Note 7) The method according to Note 1, further comprising forming a via hole penetrating the insulating layer,
wherein the forming the insulating oxide film includes forming the insulating oxide film on a surface of the insulating layer and an inner surface of the via hole,
the forming the electrode includes
removing the seed layer and the insulating oxide film in an area of the via hole,
forming a second seed layer on a surface of the seed layer and the inner surface of the via hole, and
forming the electrode on the second seed layer.

According to a mode of a wiring board and a method of manufacturing a wiring hoard disclosed herein, an effect that it is possible to prevent short circuit between electrodes and decrease in reliability is achieved.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A wiring board comprising:
an insulating layer;

an insulating oxide film that is formed by forming a film of metal oxide or semimetal oxide, from above, on a surface of the insulating layer;

a seed layer that is made of metal and that is stacked, from above, on the insulating oxide film; and an electrode that is made of metal and that is formed, from above, on the seed layer, wherein the electrode has a bottom surface positioned above the surface of the insulating layer, the insulating oxide film is positioned between the surface of the insulating layer and the bottom surface of the electrode, and the insulating oxide film and the seed layer are removed from an area not overlapping the electrode to expose the insulating layer.

2. The wiring board according to claim 1, wherein the insulating oxide film is formed by forming a film of hafnium oxide that is oxide of hafnium.

3. The wiring board according to claim 2, wherein the insulating oxide film is a film of hafnium oxide that is formed by ALD (Atomic Layer Deposition) and that has a thickness of 1 to 100 nm.

4. The wiring board according to claim 1, further comprising a via that penetrates the insulating layer in an area that overlaps the electrode, wherein the seed layer includes a first seed layer that is stacked on the insulating oxide film in an area excluding an area in which the via is formed, and a second seed layer that is stacked on the first seed layer and that is formed on an outer circumference of the via.

5. The wiring board according to claim 1, wherein a side surface of the electrode has a concave portion.

6. The wiring board according to claim 1, wherein a surface of the insulating layer has a concave portion in the area not overlapping the electrode.

7. The wiring board according to claim 1, wherein the seed layer has a thickness of 30 to 3000 nm.

8. The wiring board according to claim 1, wherein the electrode includes a plurality of electrodes, the plurality of electrodes are formed adjacently with each other on the seed layer, and the insulating oxide film and the seed layer are removed from an area not overlapping the plurality of electrodes to expose the insulating layer.

\* \* \* \* \*